(12) United States Patent
Bybee et al.

(10) Patent No.: US 6,260,231 B1
(45) Date of Patent: *Jul. 17, 2001

(54) AIR KNIFE DRYING SYSTEM (75) Inventors: Scott E. Bybee; Curtis Anthony Foster, both of Camdenton, MO (US)

(73) Assignee: Speedline Technologies, Inc., Camdenton, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,239

(22) Filed: Feb. 19, 1999

(51) Int. Cl.[7] ........................................ B08B 5/02
(52) U.S. Cl. ......................... 15/309.2; 15/316.1; 15/346
(58) Field of Search ............................... 15/306.1, 309.1, 15/309.2, 316.1

(56) References Cited

U.S. PATENT DOCUMENTS

| | | | | |
|---|---|---|---|---|
| 2,413,937 | * | 1/1947 | Zademach et al. | 15/309.2 X |
| 3,191,210 | * | 6/1965 | Fischer | 15/316.1 X |
| 3,421,211 | * | 1/1969 | Eaves et al. | 15/309.2 X |
| 3,601,837 | * | 8/1971 | Conrad et al. | 15/316.1 X |
| 3,849,831 | * | 11/1974 | DeVerter et al. | 15/309.2 X |
| 3,889,311 | * | 6/1975 | Kieronski et al. | 15/309.1 |
| 4,420,854 | * | 12/1983 | Newton | 15/309.2 X |
| 4,732,173 | | 3/1988 | Czaja et al. . | |
| 5,045,120 | | 9/1991 | Mittag et al. . | |
| 5,113,882 | | 5/1992 | Gileta . | |
| 5,205,303 | | 4/1993 | Gileta . | |
| 5,398,372 | * | 3/1995 | Kush | 15/309.1 |
| 5,534,067 | | 7/1996 | Fulker et al. . | |

FOREIGN PATENT DOCUMENTS

2338939 * 2/1975 (DE) .................................. 15/309.2

* cited by examiner

*Primary Examiner*—Chris K. Moore
(74) *Attorney, Agent, or Firm*—Mintz, Levin, Cohn, Ferris, Glovsky and Popeo, P.C.

(57) ABSTRACT

System for drying printed circuit boards in a liquid cleaning apparatus. The liquid cleaning apparatus includes a series of air knife dryers enclosed within two drying modules. The first drying module houses a first set of top and bottom air knife dryers which includes at least one top air knife dryer, positioned above a conveyor belt carrying printed circuit boards through the liquid cleaning apparatus, and at least one bottom air knife dryer, positioned below the conveyor belt. The air knife dryers may be symmetrically opposed and aligned above and below the conveyor belt. The liquid cleaning apparatus further includes side air knife dryers disposed along the conveyor belt between the first drying module and the second drying module.

15 Claims, 6 Drawing Sheets

AIR KNIFE DRYING SYSTEM

FIELD OF THE INVENTION

The present invention provides a drying system for use with a liquid cleaning apparatus designed to clean and dry workpieces, such as printed circuit boards and the like. More specifically, embodiments of the present invention are directed to a drying system and method to remove water and liquid cleaner residues from printed circuit boards.

BACKGROUND OF THE INVENTION

Figure 1:
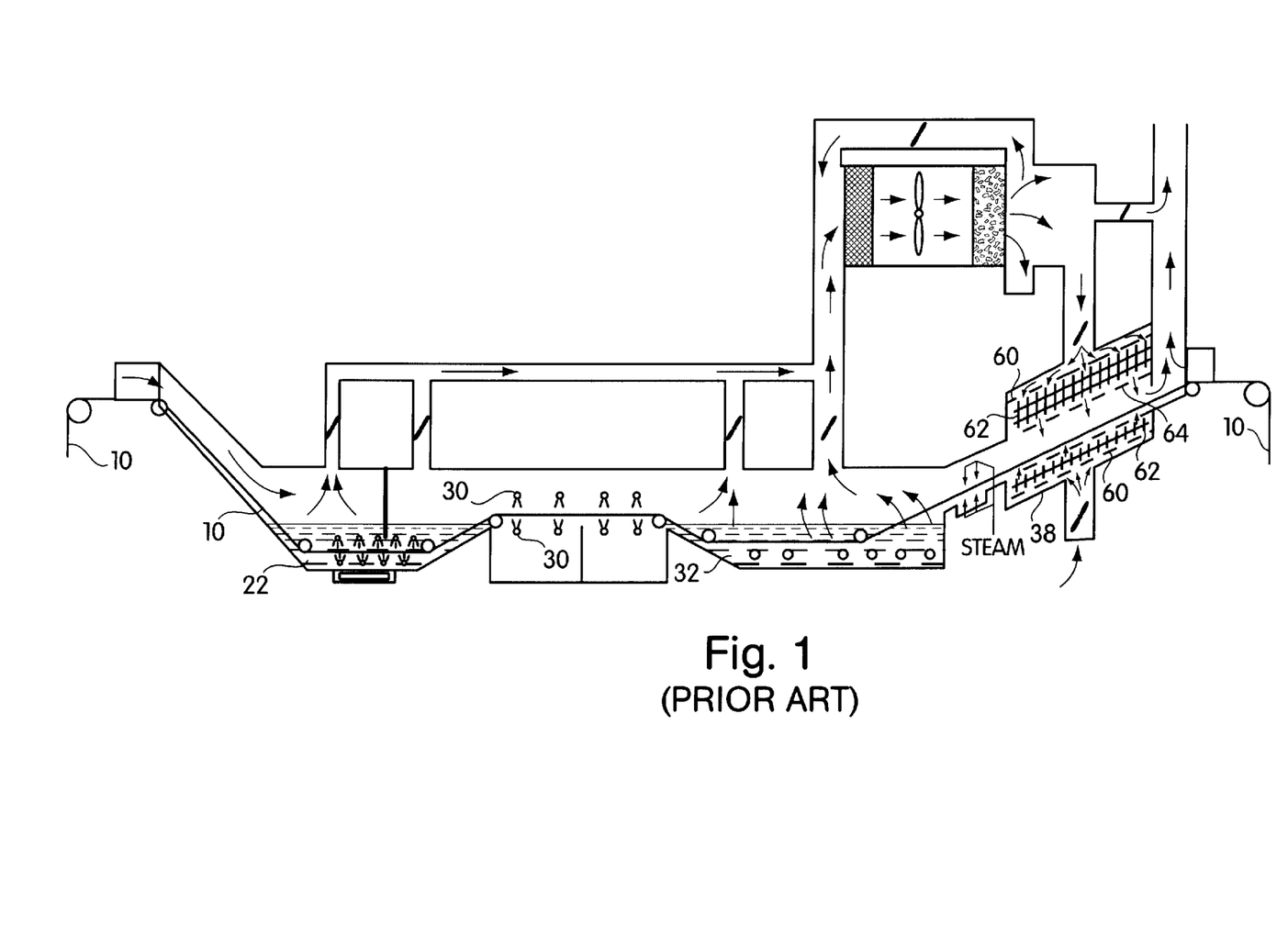
FIG. 1 shows a diagrammatic cross section of a liquid cleaning system for printed circuit boards as described in U.S. Pat. No. 5,113,882.

Various types of liquid cleaning systems are used to clean printed circuit boards for removal of contaminates, such as flux residues, resins and the like, which remain on printed circuit boards emerging from the soldering process. Liquid cleaning systems, such as that disclosed in U.S. Pat. No. 5,113,882, incorporated herein by reference, typically include a series of processing chambers, each dedicated to a specific phase of the cleaning process, through which printed circuit boards pass. As shown in FIG. 1, printed circuit boards enter a liquid cleaning system on a conveyor chain or belt 10 and move through each cleaning chamber including a washing tank 22, hot water sprays 30, a second washing tank 32, and a drying chamber 38 from which printed circuit boards exit the cleaning system. Liquid cleaners used in such liquid cleaning systems include saponified cleaning agents and terpene-based solvents which have low flash points and are potentially flammable and explosive when sprayed in air. In addition, such liquid cleaning agents and solvents are highly volatile and produce unpleasant odors when released in air. For this reason, many liquid cleaning systems, such as shown in FIG. 1, are enclosed systems in which vapors and liquid particles produced from use of such cleaning agents and solvents are contained within the liquid cleaning systems by various means of condensation and air recirculation. Other liquid cleaning systems purge inert gas, such as $N_2$, into the atmosphere of the cleaning chambers to displace air and minimize the potential for ignition or explosion, as well as to form liquid seals at the entrance and exit openings and between cleaning chambers.

Despite such methods, cleaning agent vapors are released into the air outside of the liquid cleaning system by evaporation of water particles and cleaning agent residues that are not removed in the drying chamber 38 and remain on printed circuit boards exiting the liquid cleaning system. The drying chamber 38 is typically the last phase of the cleaning process in which water particles and cleaning agent residues can be removed from clean printed circuit boards. It is, therefore, advantageous to substantially dry printed circuit boards within the liquid cleaning system before printed circuit boards are exposed to the external environment. It is also advantageous to remove cleaning agent residues from printed circuit boards as such residues can cause short circuits during performance tests of printed circuit boards and during the operation of printed circuit boards.

Figure 2:
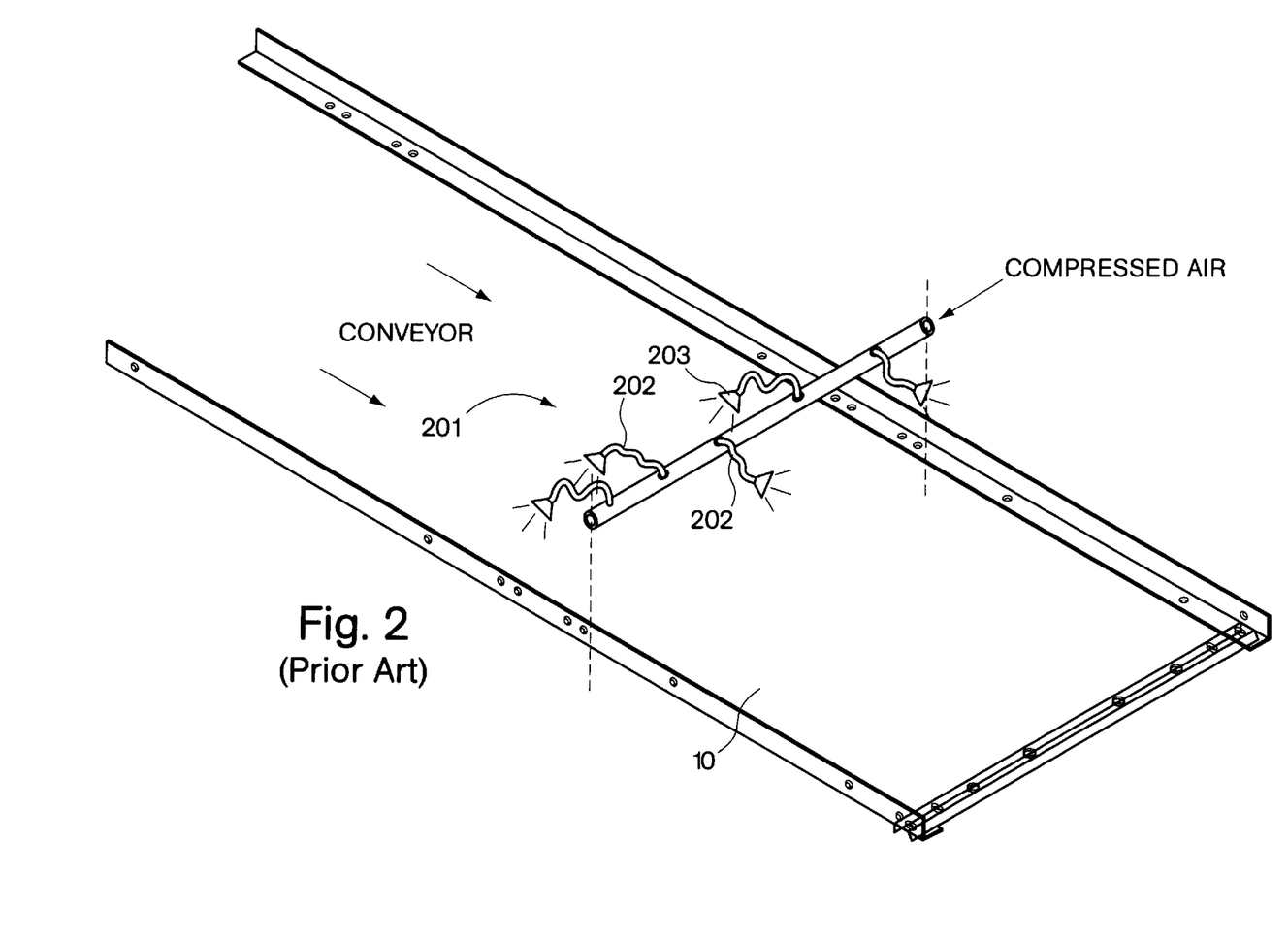
FIG. 2 shows a perspective view of prior art directional nozzle type air dryers.

As shown in FIG. 1, prior art drying systems include the drying chamber 38 in which water and cleaning agent residues are removed from printed circuit boards by blowing steam and/or air onto the surfaces of printed surface boards. The drying chamber 38 is equipped with air diffusers 60 positioned above and below the conveyer belt 10 to provide a uniform flow of air onto both the top and bottom surfaces of the printed circuit boards. The dryer chamber 38 is also equipped with heaters 62 to warm air and deflectors 64 to direct air flow. Another embodiment of prior art dryers is shown in FIG. 2 and includes directional nozzle dryers 201 positioned above and below the conveyor belt 10. The nozzle dryers include flexible metal tubing 202, capable of adjustment to direct air flow, and nozzle heads of various designs, such as flare and fan nozzle heads 203. Other prior art drying systems utilize air knife dryers to deliver compressed air to the surfaces of printed circuit boards.

Prior art dryers such as those described above, are typically positioned above and below printed circuit boards as the circuit boards are conveyed through the drying chamber. Prior art dryers primarily function to dry only the top and bottom surfaces of printed circuit boards and are not capable of directing sufficient steam and/or air to remove water and cleaning agent residues from the sides of printed circuit boards nor any electrical components mounted thereon. Prior art drying systems typically used in liquid cleaning systems do not provide for side drying.

Prior art dryers use typically steam and/or normal, heated or pressurized air as drying agents to forcibly remove water and residual cleaning agents from printed circuit boards. Air knife dryers are used particularly to concentrate and deliver pressurized air onto the surfaces of printed circuit boards, forcibly removing remaining water particles and cleaning agent residues.

SUMMARY OF THE INVENTION

Embodiments of the present invention provide a system and method for drying printed circuit boards and the like in a liquid cleaning system that produces substantially drier printed circuit boards than prior art drying systems and achieves greater economy in the use of air as a drying agent.

In one general aspect, the invention provides a system and method for drying printed circuit boards in a liquid cleaning apparatus which includes a series of air knife dryers enclosed within two drying modules. The first drying module houses a first set of top and bottom air knife dryers which includes at least one top air knife dryer, positioned above a conveyor belt carrying printed circuit boards through the liquid cleaning apparatus, and at least one bottom air knife dryer, positioned below the conveyor belt. The air knife dryers are preferably symmetrically opposed and aligned above and below the conveyor belt. It is also preferable that the first set of top and bottom air knife dryers include an additional top air knife dryer located above the conveyer belt. The printed circuit boards pass between the top and bottom air knife dryers which deliver pressurized air in a substantially perpendicular flow directly onto both the top and bottom surfaces of the printed circuit boards as desired thereby forcibly removing water particles and cleaning agent residues. Printed circuit boards pass under the second top air knife dryer which, like the first set of top and bottom air knife dryers 110, similarly delivers air in a substantial perpendicular flow onto the top surfaces of the printed boards and removes water particles and cleaning agent residues thereon.

After passing under the second top air knife dryer, the printed circuit boards continue through the first drying module and pass at least one side air knife dryer, and preferably two side air knife dryers positioned adjacent to the conveyor belt and downstream from the first set of top and bottom air knife dryers. The side air knife dryers are preferably symmetrically opposed and aligned on either side of the conveyor belt. The side air knife dryers may be similar to the first set of top and bottom air knife dryers. As the printed circuit boards pass between the side air knife dryers, pressurized air is delivered in a substantially parallel flow directly onto the sides of printed circuit boards as desired, forcibly removing water particles and cleaning agent residues from the sides of printed circuit boards and any electrical components mounted thereon, as well as metal and other electrical edge contacts common to printed circuit boards. Printed circuit boards continue to pass through the first drying module and enter a second drying module.

The second drying module is positioned downstream from the first drying module and houses a second set of top and bottom air knife dryers which may be similar to the first set of air knife dryers. The second set of top and bottom air knife dryers includes at least one top air knife dryer and at least one bottom air knife dryer positioned above and below the conveyor belt and preferably symmetrically opposed and aligned. An additional top air knife dryer located above the conveyor belt is also preferred. Printed circuit boards move through the second drying module and pass between the second set of top and bottom air knife dryers. The top and bottom air knife dryers deliver pressurized air in a substantially perpendicular flow directly onto the top and bottom surfaces of printed circuit boards as desired and forcibly remove water particles and cleaning agent residues remaining thereon. Printed circuit boards continue through the second drying module and pass under the second top air knife dryer which, like the second set of top and bottom air knife dryers 120, similarly removes water particles and cleaning agent residues from the top surfaces of printed circuit boards by delivering air in a substantially perpendicular flow onto the top surfaces of printed circuit boards. Printed boards continue to pass through the second drying module 141 and exit the liquid cleaning apparatus.

The top, bottom and side air knife dryers may be similar and include an elongated cylindrical body with an elongated air blade mounted on one side of the cylindrical body whose length extends the length of the cylindrical body. The air blade protrudes outward from the cylindrical body and tapers into a slotted nozzle head. The air knife dryer manifolds pressurized air in the cylindrical body from which air is concentrated and directed onto the surfaces of printed circuit boards as desired by the air blade and the slotted nozzle head.

Each of the drying modules is provided with an air system which includes an external air source, such as well known turbine-type or cylindrical piston-type air blowers, for generating high pressure air at a high volume, an air delivery system which includes a plurality of air inlet pipes with each air inlet pipe connected at one end to the external air source and at another end to an air knife dryer, and an air return which includes a recirculation trough positioned downstream from the air knife dryers and below the conveyor belt.

The external air source, such as a turbine air blower, delivers high pressure air at a high volume into the air inlet pipes which direct pressurized air into the air knife dryers. The air blades and the slotted air nozzles of the air knife dryers concentrate and deliver pressurized air in a preferred orientation directly onto the surfaces of printed circuit boards as desired. The impingement of air on the surfaces of printed circuit boards forcibly removes water particles and cleaning agent residues remaining thereon. Water particles and cleaning agent residues removed from the surfaces of printed circuit boards become atomized in the atmosphere within the drying modules. Air within the drying modules is drawn toward an end of each drying module which is constructed and arranged as a recirculation trough which is positioned in each module downstream from the air knife dryers and below the conveyor belt. Air is drawn into the recirculation trough by means of a vacuum created by connection of the recirculation trough to the turbine air blower. Air flows into the recirculation trough and through a side wall of the recirculation trough constructed and arranged in an S-configuration which includes two parallel side plates with a first side plate extending downward into the recirculation trough leaving an opening at the bottom of the recirculation trough and a second side plate extending upward leaving an opening at the top of the recirculation trough. Air flows under the first side plate and over the second side plate in an S-configuration whereby moisture is condensed from air, flows to the bottom of the recirculation trough from which it drains and exits the drying modules. Air is drawn from the recirculation trough to an air filter mounted on the turbine air blower. The air filter removes moisture remaining in air prior to returning it to the turbine air blower for recirculation to the air knife dryers.

The turbine air blower recirculates air to the air knife dryers in a closed loop. In one embodiment, with each completion of the loop, the temperature of air in the closed loop increases by approximately 40° F. until the air reaches an approximate maximum temperature of about 160° F. at which it remains for the duration of operation of the air knife drying system. Recirculation of air eliminates the need for heaters and efficiently heats air to a drying temperature.

BRIEF DESCRIPTION OF THE DRAWINGS

For a better understanding of the present invention, reference is made to the drawings which are incorporated herein by reference and in which.

DETAILED DESCRIPTION OF THE INVENTION

Illustrative embodiments of the present invention described below are directed to an air knife drying system for use in a liquid cleaning apparatus designed for the removal of contaminates from workpieces, including soldering contaminates remaining on printed circuit boards and the like.

Figure 3:
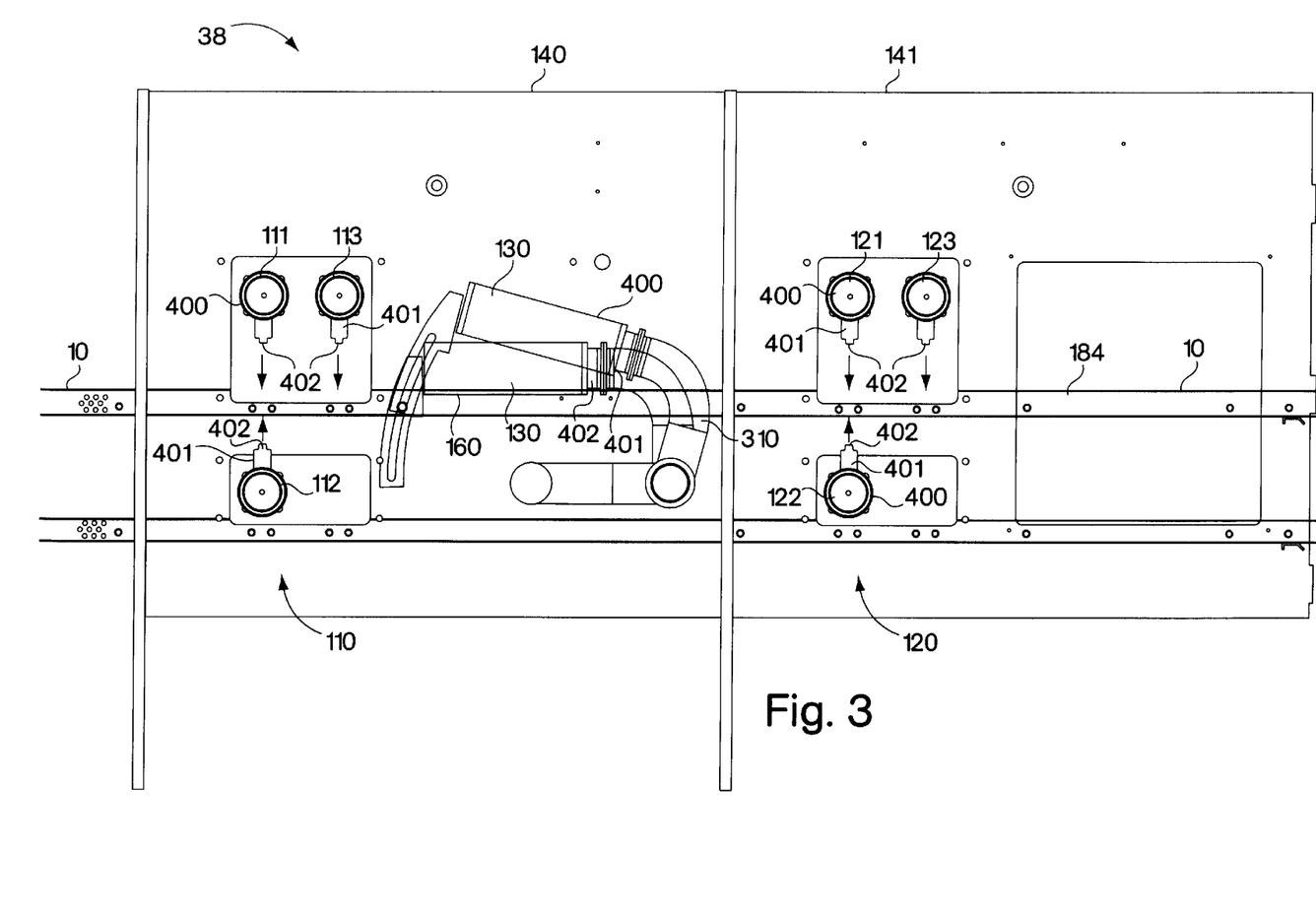
FIG. 3 is a side view of two modules in a drying chamber, containing a first set of air knife dryers, side air knife dryers and a second set of air knife dryers.

Embodiments of the present invention will now be described with reference to FIGS. 3–6. FIG. 3 shows one embodiment of an air knife drying system in a drying chamber 38 of a liquid cleaning apparatus which includes two drying modules, each of which houses a series of air knife dryers. The two drying modules include a first drying module 140, which houses a first set of top and bottom air knife dryers 110 and a pair of side air knife dryers 130 and 160, and a second drying module 141, which houses a second set of top and bottom air knife dryers 120.

Printed circuit boards emerge from cleaning and rinsing chambers of the liquid cleaning apparatus and enter the first drying module 140 on a conveyor belt 10, supported on a conveyor frame 184 in a known manner as illustrated in FIG. 3, the first set of top and bottom air knife dryers 110 features a top air knife dryer 111 located above the conveyor belt 10 and a bottom top air knife dryer 112 located below the conveyor belt 10. The top air knife dryer 111 and the bottom air knife dryer 112 are preferably symmetrically opposed and aligned above and below the conveyor belt 10. The first set of top and bottom air knife dryers 110 includes two air knife dryers and preferably three air knife dryers with a second top air knife dryer 113 positioned above the conveyor belt 10. While three top and bottom air knife dryers, 111, 112 and 113 are shown in the embodiment of FIG. 3, it is understood that less than or more than three top and bottom air knife dryers may be used in other embodiments of the present invention.

Figure 4:
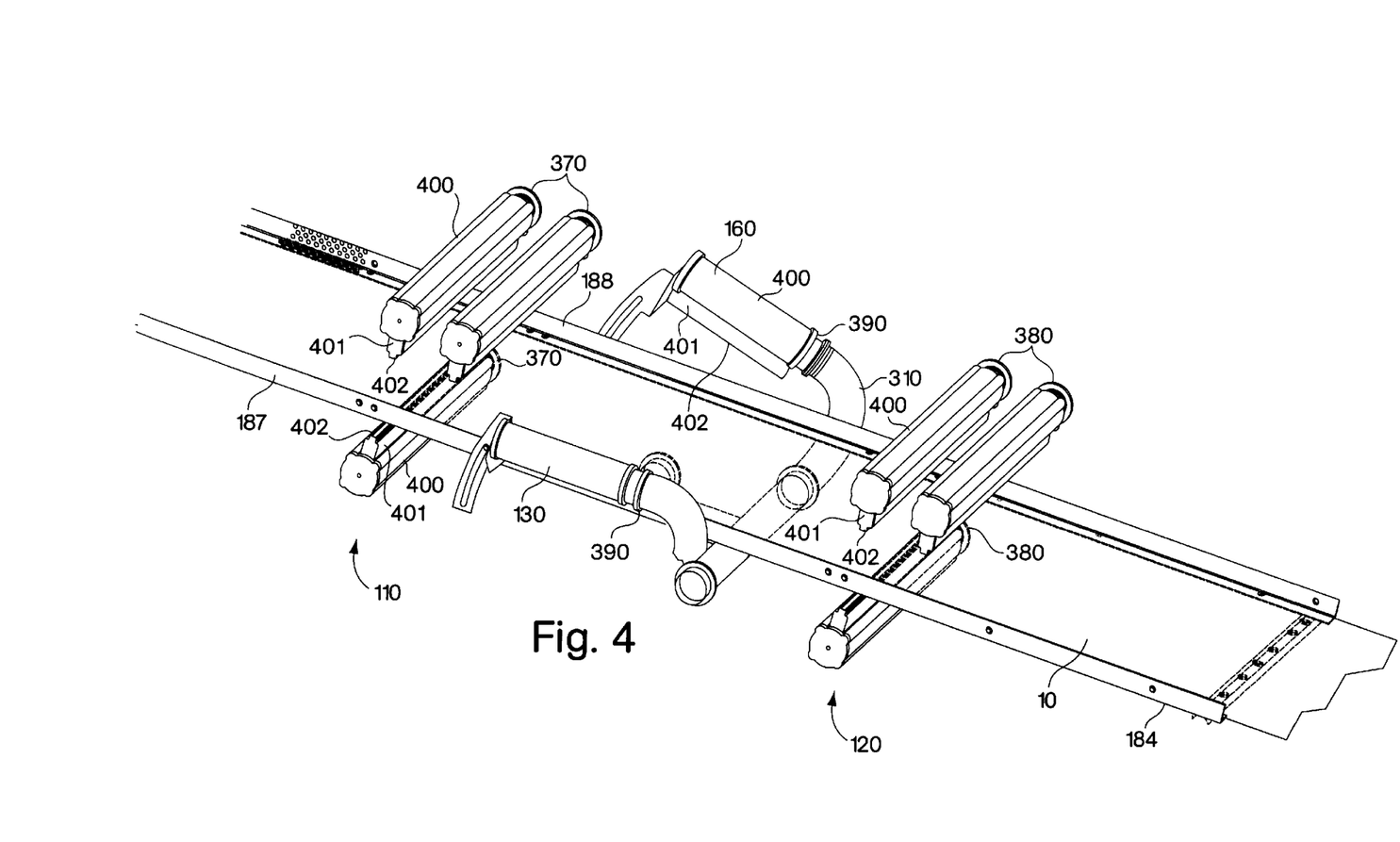
FIG. 4 is a perspective view of the arrangement of the air knife dryers in the drying modules.

As shown in FIGS. 3 and 4, each air knife dryer of the first set of top and bottom air knife dryers 110 may be similar and include an elongated, cylindrical body 400 with an elongated air blade 401 mounted on one side of the cylindrical body 400 that extends the length of the cylindrical body 400. The air blade 401 protrudes outward from the side of the cylindrical body 400 and tapers to a slotted nozzle head 402. The air blade 401 and the slotted nozzle head 402 concentrate and direct air onto the surfaces of printed circuit boards as desired. FIG. 4 shows an end 370 of each of the first set of top and bottom air knife dryers 110. The end 370 is constructed and arranged for connection to an air inlet pipe 310 for delivery of air into the air knife dryers 110.

As printed circuit boards move through the first drying module 140 and pass between the top air knife dryer 111 and the bottom air knife dryer 112, the slotted nozzle heads 402 of the first set of top and bottom air knife dryers 110 concentrate and deliver air directly onto the top and bottom surfaces of printed circuit boards in a substantially perpendicular flow. Air impinges the top and bottom surfaces and forcibly removes water particles and cleaning agent residues remaining thereon. Printed circuit boards subsequently pass under the slotted nozzle head 402 of the second top air knife dryer 113 which, like the first set of top and bottom air knife dryers 110, concentrates and delivers air directly onto the top surfaces of printed circuit boards in a substantially perpendicular flow. Water particles and residues of cleaning agents are forcibly removed by air impinging on the top surfaces.

Printed circuit boards continue to move through the first drying module 140 and, as shown in the embodiment of FIG. 3, pass a side air knife dryer 130 and preferably between a pair of side air knife dryers with two side air knife dryers 130 and 160 on either side of the conveyor belt 10. The side air knife dryers 130 and 160 are preferably symmetrically opposed and aligned, and preferably positioned downstream from the first set of top and bottom air knife dryers 110. However, as described herein with respect to FIG. 5, the dryers are angularly adjustable with respect to the conveyor belt 10 and with respect to each other to facilitate impingement of air at selected orientations to the conveyor belt 10. Although FIG. 3 shows two side air knife dryers 130 and 160, it is understood that less than or more than two side air knife dryers may be used in other embodiments of the present invention.

As shown in FIG. 4, the side air knife dryers 130 and 160 may be similar to the first set of top and bottom dryers of the embodiment shown in FIG. 3 and include an elongated cylindrical body 400 with an elongated air blade 401 mounted thereon whose length extends the length of the cylindrical body. The air blade 401 protrudes outward from the cylindrical body 400 of the air knife dryer, tapering to a slotted nozzle head 402. The side air knife dryers 130 and 160 each have an end 390 constructed and arranged for connection to an air inlet pipe 310.

Figure 5:
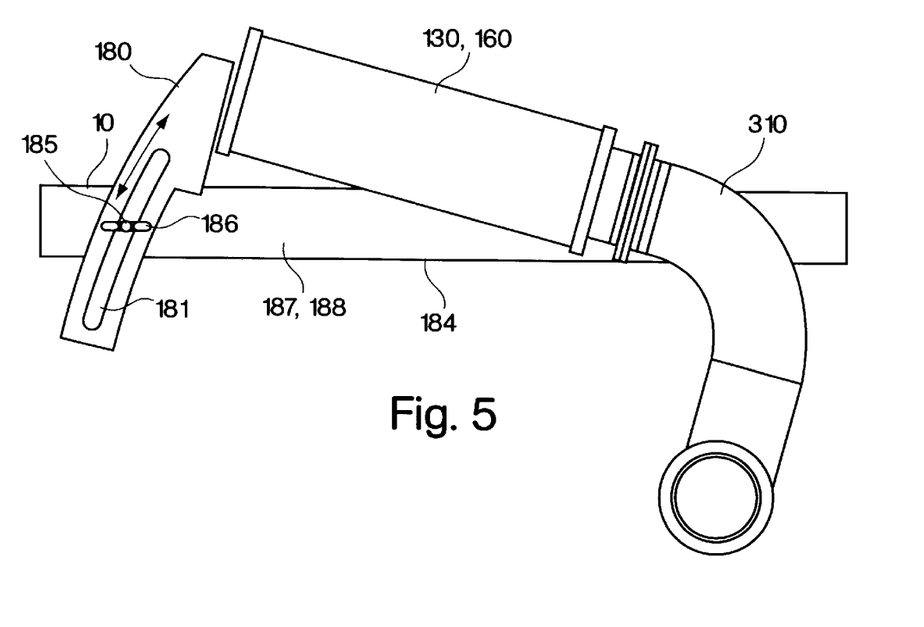
FIG. 5 is a side view of the side air knife dryer.

As shown in FIGS. 3–5, the side air knife dryers 130 and 160 are vertically adjustable for changing the height and angle of each dryer to a desired position in relation to the printed circuit boards on the conveyor belt 10 and to each other in order to deliver sufficient air onto the side surfaces of printed circuit boards. As shown in FIGS. 3–5, an end of each of the side air knife dryers 130 and 160 is configured and arranged as an elongated, slotted plate 180 that is adjustably attached to a side edge 187 and 188 of the conveyor frame 184 which enables vertical adjustment of the height and the angle of the side air knife dryers 130 and 160. Vertical adjustment is achieved by a central slot 181 that extends almost the length of the slotted plate 180. The central slot 181 is configured to accept a fastener 183 mounted on the side edge 187 and 188 of the conveyor frame 184 which secures the side knife dryers 130 and 160 to the side edge 187 and 188 and permits upward and downward movement of the side knife dryers 130 and 160 along a vertical plane. The fastener 183 is preferably a nut and bolt assembly, as shown in FIG. 5, whereby a bolt 185 penetrates the side edge 187 and 188 of the conveyor frame 184 and fits into the central slot 181 of the slotted plate 180. The bolt 185 is sized to receive a nut 186 which secures the side air knife dryers 130 and 160 in a desired position or, when sufficiently loosened, permits vertical adjustment. Other adjustment devices, well known in the art, may be used in lieu of the arrangement shown in FIGS. 3–5. Such adjustment devices may include hydraulic, electric or pneumatic actuators, for example.

As FIG. 3 shows, printed circuit boards pass between the side air knife dryers 130 and 160 as they are conveyed through the first drying module 140. The slotted nozzle heads 402 of the side air knife dryers 130 and 160 concentrate and direct air in a substantially parallel flow onto the sides of printed circuit boards at a selected height and angle relative to the conveyor belt. The impingement of air on the sides of printed circuit boards forcibly removes water particles and cleaning agent residues Printed circuit boards exit the first drying module 140 after passing between the side air knife dryers 130 and 160 and enter the second drying module 141 in which the last phase of drying is achieved. The second drying module 141 houses a second set of top and bottom air knife dryers 120 which may be similar to the first set of top and bottom air knife dryers 110. The second set of top and bottom air knife dryers 120, as the first set of air knife dryers 110, is shown in the embodiment of FIG. 3 as featuring two air knife dryers including a top air knife dryer 121 positioned above the conveyor belt 10 and a bottom air knife dryer 122 positioned below the conveyor belt 10 and preferably symmetrically opposed and aligned. The second set of air knife dryers 120 preferably includes a second top air knife dryer 123 positioned above the conveyor belt 10. While three top and bottom air knife dryers 121, 122 and 123 are shown in FIG. 3, it is understood that less than or more than three top and bottom air knife dryers may be used in other embodiments of the present invention.

The second set of top and bottom air knife dryers 120 may be similar to the first set of air knife dryers 110 and the side air knife dryers 130 and 160 and include an elongated cylindrical body 400, as shown in the embodiment of FIG. 4, with an elongated air blade 401 the length of the cylindrical body and mounted thereon which protrudes outward from the cylindrical body 400 and tapers to a slotted nozzle head 401. An end 380 of each of the second set of top and bottom air knife dryers 120 is constructed and arranged to be connected to an air inlet pipe 310 for delivery of air.

As FIG. 3 shows, printed circuit boards pass the second set of air knife dryers 120, moving between the top air knife dryer 121 and the bottom air knife dryer 122. Air is concentrated and delivered by the slotted nozzle head 402 of the top air knife dryer 121 and of the bottom air knife dryers 122 in a substantially perpendicular flow onto the top and the bottom surfaces as desired from which water particles and residues of cleaning agents are forcibly removed by the impingement of air on the top and bottom surfaces. Printed circuit boards pass under the second top air knife dryer 123 from which the slotted nozzle head 402 concentrates and delivers air, like the second set of top and bottom air knife dryers 120, in a substantially perpendicular flow directly onto the top surfaces of the printed circuit boards as desired, removing water particles and cleaning agent residues remaining thereon. Printed circuit boards move out of the second drying module 141 and exit the liquid cleaning apparatus.

Figure 6:
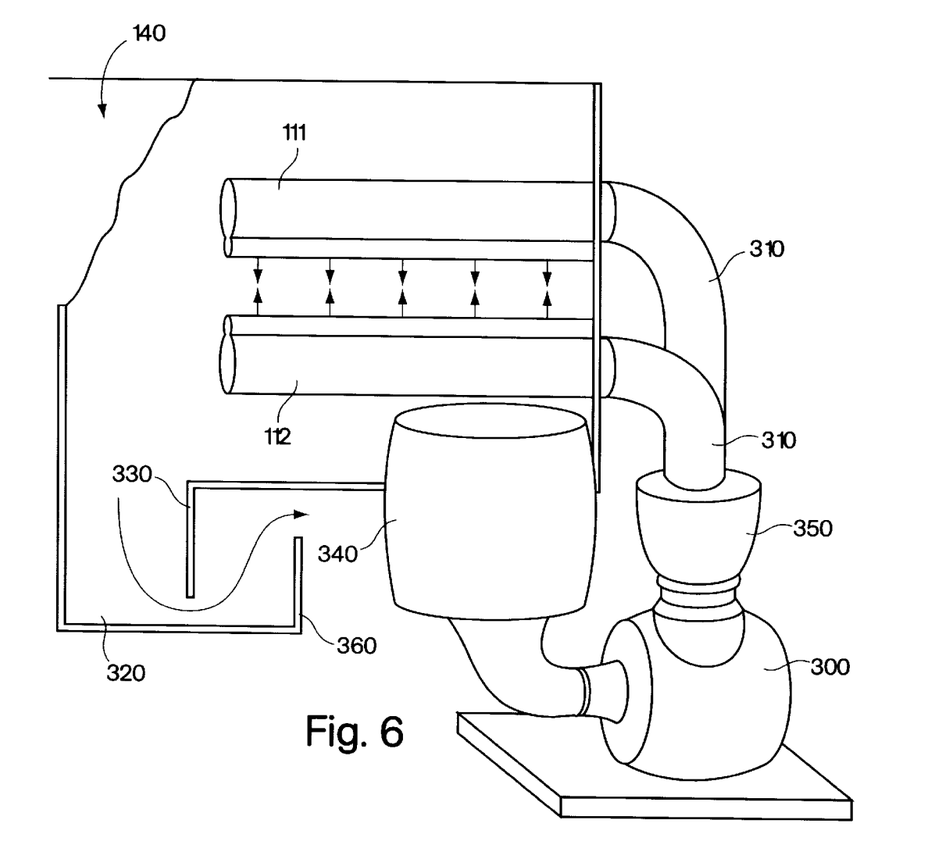
FIG. 6 is a side view of one of the drying modules including a turbine air blower, air inlet pipes connected to the top and bottom air knife dryers, and a recirculation trough and the air filter.

FIG. 6 shows another embodiment of the present invention including an air system for each of the drying modules 140 and 141 which features an external air source 300, such as a well known turbine-type air blower, a plurality of air inlet pipes 310, an air recirculation trough 320 and an air filter 340. It is understood that while a turbine air blower is described and shown in the embodiment of FIG. 6, that other well known air moving devices, such as cylindrical piston-type pumps, for example, may be utilized in the present invention as an air source.

As FIG. 6 shows, a turbine air blower 300 is located externally to the liquid cleaning apparatus adjacent to that portion of the liquid cleaning apparatus which encloses the first drying module 140 or the second drying module 141. The turbine air blower 300 features a top-mounted manifold 350 to which a plurality of air inlet pipes 310 are connected. The plurality of air inlet pipes 310 access the drying modules 140 and 141 of the liquid cleaning apparatus through side wall panels of the cleaning apparatus and connect to the ends of the air knife dryers 370, 380 and 390. The turbine air blower 300 generates a high volume of high pressure air which is forced through the manifold 350 and into the plurality of air inlet pipes 310. The plurality of air inlet pipes 310 delivers pressurized air to the air knife dryers 111 and 112. The air nozzle heads 402 of the air knife dryers concentrate and deliver air in a preferred orientation directly onto the surfaces of printed circuit boards thereby forcibly removing water particles and cleaning agent residues from the surfaces of printed circuit boards. Water particles and cleaning agent residues removed from printed circuit boards become atomized and circulate in the atmosphere within the drying modules 140 and 141. Air is drawn through the drying modules 140 and 141 and toward an end of each of the drying modules 140 and 141 positioned downstream from the air knife dryers and below the conveyor belt 10. The ends of the drying modules form a recirculation trough 320. Air is drawn into the recirculation trough 320 by a vacuum created from connection of the recirculation trough 320 to the turbine air blower 300. Air is drawn downward into the recirculation trough 320 and flows through a side wall of the recirculation trough 320 which is constructed and arranged as two parallel side plates in an S-configuration. The S-configuration has a first side plate 330 extending downward and perpendicular to the bottom of the recirculation trough 320. The side plate 330 has a length that creates an opening at the bottom of the recirculation trough 320. The S-configuration also includes a second side plate 360 extending upward and perpendicular to the top of the recirculation trough 320 leaving an opening at the top of the recirculation trough 320. Air flows under the first side plate 330 and over the second side plate 360 in an S-configuration whereby moisture condenses from air, flows to the bottom of recirculation trough 320 and drains from the drying modules 140 and 141. Air is returned from the recirculation trough 320 to the turbine air blower 300 through an air filter 340 which is externally mounted to the turbine air blower 300. Moisture is removed from returned air drawn through the air filter 340 prior to returning to the turbine air blower 300. Air returned to the turbine air blower 300 is recirculated to the air knife dryers.

The recirculation of air in the air knife drying system occurs in a closed loop achieved by circulation of air through the turbine air blower 300, the air drying modules 140 and 141, the recirculation trough 360 and back to the turbine air blower 300. In one embodiment, as air circulates, air temperature increases by approximately 40° F. with each completion of the loop until the air temperature increases to approximately 160° F., at which it remains for the duration of operation of the air knife drying system.

The present invention provides an economical use of air as a drying agent. Recirculation heats air efficiently and maintains a drying air temperature throughout operation of the air knife drying system, eliminating the need for heaters. In addition, the use of an air source such as the turbine air blower is an inexpensive method of generating a high volume of air at a high pressure.

The present invention also produces substantially drier printed circuit boards which are processed by liquid cleaning systems. As Table I below indicates, the use of side air knife dryers of the present invention in a liquid cleaning apparatus results in greater removal of water particles and cleaning agent residues and, ultimately, drier printed circuit boards.

TABLE I

SIDE AIR KNIFE TEST DATA

|  | Dry Wt. | Air Knife Off (Avg.) | Water Left AK Off | Air Knife On (Avg.) | Water Left AK On |
| --- | --- | --- | --- | --- | --- |
| Board #1 | 242.01 g | 242.5 g | 0.58 g | 242.1167 g | 0.1066667 g* |
| Board #2 | 243.33 g | 243.9467 g | 0.6166667 g | 243.4267 g | 0.0966667 g** |
| Board #3 | 534.91 g | 536.275 g | 1.365 g | 535.645 g | 0.735 g+ |
| Board #4 | 540.11 g | 541.24 g | 1.13 g | 540.675 g | 0.565 g++ |

*87% Reduction in Water Left on Board #1 with Side Air Knife Dryers
**84.3% Reduction in Water Left on Board #2 with Side Air Knife Dryers
+46.0% Reduction in Water Left on Board #4 with Side Air Knife Dryers
++50% Reduction in Water Left on Board #5 with Side Air Knife Dryers Table I shows that there is greater removal of water particles and liquid cleaning residues from printed circuit boards with the use of side air knife dryers in a liquid cleaning apparatus. Boards #1 and #2 are test boards with only side connectors, while boards #3 and #4 are custom printed circuit boards with highly populated side connectors. The higher percentage of water remaining on boards #3 and #4 demonstrates that with an increasing number of side-mounted components, the removal of water particles and residues from the sides of printed circuit boards becomes more difficult and the need for side drying even greater. The present invention provides an air knife drying system with side air knife dryers which produces drier printed air boards than prior art systems.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An air knife drying system for use in a drying chamber of a liquid cleaning apparatus for drying articles on a conveyor belt, the conveyor belt having an upper surface and a lower surface, comprising:
    a first set of at least two air knife dryers including an air knife dryer positioned above the upper surface of the conveyor belt and an air knife dryer positioned below the lower surface of the conveyor belt; and
    a first side air knife dryer positioned adjacent to the first set of air knife dryers and a first side edge of a frame supporting the conveyor belt in the drying chamber.

2. The air knife drying system of claim 1, wherein each of the first set of air knife dryers is vertically aligned with the other.

3. The air knife drying system of claim 1, wherein the air knife dryer of the first set positioned above the conveyor belt is oriented to deliver air flow substantially perpendicular to the upper surface of the conveyor belt, and the air knife dryer of the first set positioned below the conveyor belt is oriented to deliver air flow substantially perpendicular to the lower surface of the conveyor belt.

4. The air knife drying system of claim 1, wherein the first side air knife dryer is oriented to deliver air flow substantially parallel to the upper surface of the conveyor belt.

5. The air knife drying system of claim 1, further comprising a second side air knife dryer positioned adjacent to the first set of air knife dryers and a second side edge of the frame supporting the conveyor belt.

6. The air knife drying system of claim 5, wherein the second side air knife dryer is oriented to deliver air flow substantially parallel to the top surface of the conveyor belt.

7. The air knife drying system of claim 5, wherein the second side air knife dryer is horizontally aligned with the first side air knife dryer.

8. The air knife drying system of claim 5, wherein each of the first and second the side air knife dryers includes:
    an elongated hollow member having a first terminal end and a second terminal end with a side wall connecting the first and second terminal ends, the first terminal end being structured and configured to connect to an air source; and
    an elongated hollow air blade mounted on the side wall of the hollow member, the air blade protruding from the hollow member and tapering to a nozzle head.

9. The air knife drying system of claim 8, wherein the second terminal end of each of the first and second side air knife dryers is adjustably connected to the first and second side edges, respectively, of the frame supporting the conveyor belt.

10. The air knife drying system of claim 9, wherein height and angle of each of the first and second side air knife dryers is vertically adjusted by upward or downward movement along a vertical plane.

11. The air knife drying system of claim 1, wherein each of the first set of air knife dryers includes:
    an elongated hollow member having a first terminal end and a second terminal end with a side wall connecting the first and second terminal ends, the first terminal end being structured and configured to connect to an air source; and
    an elongated hollow air blade mounted on the side wall of the hollow member, the air blade protruding from the hollow member and tapering to a nozzle head.

12. The air knife drying system of claim 1, further comprising an air circulation system positioned in the drying chamber for delivery and recirculation of air to each of the air knife dryers including:
    an air source;
    an air delivery system connected to the air source for delivery of air; and
    an air return for return of delivered air to the air source for recirculation.

13. The air knife drying system of claim 12, wherein the air source is a turbine air blower.

14. The air knife drying system of claim 12, where in the air delivery system includes a plurality of air inlet pipes with each air inlet pipe having a first end connected to the air source and a second end connected to one of the air knife dryers.

15. The air knife drying system of claim 12, wherein the air return includes a recirculation trough below the conveyor belt having a side wall constructed and arranged to cause air delivered by the air knife dryers into the drying chamber to flow in an S-configuration and to condense water vapor from delivered air; and
    an air filter through which delivered air is returned to the air source.

* * * * *

UNITED STATES PATENT AND TRADEMARK OFFICE
CERTIFICATE OF CORRECTION

PATENT NO. : 6,260,231 B1  Page 1 of 1
DATED : July 17, 2001
INVENTOR(S) : Scott E. Bybee et al.

It is certified that error appears in the above-identified patent and that said Letters Patent is hereby corrected as shown below:

Column 10,
Line 2, delete "the" (second occurrence).

Signed and Sealed this

Twenty-fifth Day of June, 2002

Attest:

JAMES E. ROGAN
Attesting Officer  Director of the United States Patent and Trademark Office